United States Patent
Ichihara et al.

(10) Patent No.: US 6,711,198 B1
(45) Date of Patent: Mar. 23, 2004

(54) LIGHT SOURCE DEVICE FOR LASER BEAM PRINTER

(75) Inventors: Jun Ichihara, Kyoto (JP); Hisayoshi Kitajima, Kyoto (JP); Tetsuhiro Tanabe, Kyoto (JP); Ken Nakahara, Kyoto (JP); Haruo Tanaka, Kyoto (JP)

(73) Assignee: Rohm Co. Ltd., Kyoto (JP)

(*) Notice: Subject to any disclaimer, the term of this patent is extended or adjusted under 35 U.S.C. 154(b) by 0 days.

(21) Appl. No.: 09/549,552

(22) Filed: Apr. 14, 2000

(30) Foreign Application Priority Data

Apr. 14, 1999 (JP) .......................... 11-107313

(51) Int. Cl.[7] ................................ H01S 5/00
(52) U.S. Cl. ........................ 372/47; 372/43; 372/45; 372/46
(58) Field of Search ................. 372/45, 46, 16, 372/17, 47, 43

(56) References Cited

U.S. PATENT DOCUMENTS

| | | | | |
|---|---|---|---|---|
| 4,893,313 A | * | 1/1990 | Haatakoshi et al. | 372/45 |
| 5,323,412 A | * | 6/1994 | Iwase | 372/46 |
| 5,369,658 A | * | 11/1994 | Ikawa et al. | 372/46 |
| 5,404,370 A | * | 4/1995 | Otsubo et al. | 372/45 |
| 5,585,649 A | * | 12/1996 | Ishikawa et al. | 257/94 |
| 5,974,069 A | * | 10/1999 | Tanaka et al. | 372/46 |
| 6,118,801 A | * | 9/2000 | Ishikawa et al. | 372/46 |
| 6,292,502 B1 | * | 9/2001 | Shimada | 372/46 |
| 6,323,052 B1 | * | 11/2001 | Horie et al. | 438/46 |

* cited by examiner

Primary Examiner—Paul Ip
Assistant Examiner—Leith Al-Nazer
(74) Attorney, Agent, or Firm—Arent, Fox, Kinter, Plotkin & Kahn, PLLC

(57) ABSTRACT

A light source device for a laser beam printer in which a semiconductor laser is driven with a pulse current having a minimum pulse width at the ON time on the order of milliseconds or less is provided, wherein the semiconductor laser is formed so that either the rate of change at the rise portion of the pulse current becomes ±8% or less or the semiconductor laser is excited in a multiple mode in the vicinity of the threshold value of the oscillation, and the semiconductor laser oscillates in a single mode at a current separated from the threshold value, by adjusting of at least one of the width w of a stripe groove (7a) of the current block layer, the composition of clad layers (5), the distance d between the current block layer (7) and the active layer (4), the composition of the current block layer (7) and the formation of a light absorption layer into the current block layer (7). As a consequence, in the case where the light source device for the laser beam printer is driven with a short drive pulse on the order of several hundred micro seconds, the light source device becomes such that a transient phenomenon is not generated at the time of the rise of the pulse and a stable light output can be obtained.

14 Claims, 6 Drawing Sheets

LIGHT SOURCE DEVICE FOR LASER BEAM PRINTER

FIELD OF THE INVENTION

The present invention relates to a light source device of highly precise laser beam printers (LBP). More particularly, the invention relates to a light source device for a laser beam printer which can produce a stable output free from the occurrence generation of an overshooting (transient response) at a short-time pulse having a pulse width of not more than milliseconds for driving a laser diode and which can provide printing free from an irregularity in printed images.

BACKGROUND OF THE INVENTION

Laser beam printers can print images by drawing an electrostatic image on a photosensitive drum with laser beams and depositing a toner (a powder ink) on a portion charged with a static electricity. In order to draw the image with this laser beam, a light source device using a laser diode is employed. With the application of a pulse current to the laser diode, the light source device is driven intermittently. In this case, as shown in FIG. 8, there is generally shown a characteristic such that a light output is gradually decreased after the electrification of the laser diode is started. There is a problem in that when a droop ($\Delta P/P \times 100\%$) which represents this lowering ratio is large, an irregularity in colors likely occurs. It can be considered that the cause of the irregularity in colors can be attributed to a rise in the temperature of the laser diode. As one method for decreasing this droop, the active layer is formed in a multiple quantum well structure (MQW) to suppress the heating of the laser diode (LD) chip itself, so that the threshold current $I_{th}$ is decreased. However, when this MQW structure is adopted, the width of the energy distribution of carriers is narrowed down with the result that the oscillation spectrum width is narrowed down and a single mode oscillation is likely to be generated.

In the laser diode which oscillates in a single mode with the lowering of the above threshold current, the heating of the laser diode is reduced and the droop can be surely reduced. However, as FIGS. 9(a) through 9(b) show a driving pulse and a light output waveform, an overshooting (a transient phenomenon) A is generated at a rise portion of the pulse. The ratio of this overshooting A corresponds to the time of the order of 1 to 2 $\mu$sec, but it extends over about 20% of a stable light output. On the other hand, recently, in order to improve the printing speed of the printer, the pulse width of this drive pulse is extremely narrowed down. When a request is made to narrow down the width to not more than milliseconds, particularly to micro seconds to sub-micro seconds, the influence of the above overshooting becomes a problem as the irregularity in colors in addition to the droop.

On the other hand, the laser diode oscillates in a multiple mode by forming the active layer into, for example, a bulk active layer, the threshold current rises as described above, so that LD chip is heated and a large droop is likely to be generated. At the same time, as shown in FIG. 9(c), the light output at the rise portion is lowered on the contrary with the result that the irregularity in colors is generated and a stable output of light cannot be obtained because of further self-excited oscillation within the pulse.

SUMMARY OF THE INVENTION

The present invention has been made in order to solve the above problem. An object of the invention is to provide a light source device for a laser beam in which a transient phenomenon (a transient response) at the time of the rise of the pulse is not generated, a stable light output is obtained, and images can be printed free from an irregularity in colors even in the case where a light source device for a laser beam printer is driven with a pulse which has a small pulse width at ON time such as not more than milliseconds, particularly micro-seconds to sub-micro seconds.

After a diligent investigation to remove the irregularity in colors in printed images caused by the transient phenomenon (transient response) at the rise portion of the pulse for driving the semiconductor laser in a short pulse width as described above, the inventors of the present invention have found that a relation is present between an oscillation spectrum of a laser, for example, Full Width at Half Maximum (FWHM) and a rate of change in the transient phenomenon (a ratio $\Delta P/Po \times 100\%$, in which $\Delta P$ is a difference (Pp–Po) between a light peak output Pp at a transience at the time of the rise and a stable output Po, refer to FIG. 9(b)). And the inventors of the present invention have found that a light source device for a laser beam printer can be provided, which device does not generate the irregularity in colors with a drive pulse on the order of milliseconds to micro seconds, by adjusting the above rate of change and by setting the rate to $\pm 8\%$ or less. The rate of change is changed by adjusting the light absorption quantity of the oscillation power, and the adjusting is performed by changing, for example, a stripe width, a composition of a current block layer, a distance between a current block layer and the active layer, a carrier concentration of a clad layer and a penetration degree of a light absorption layer (penetration place or the composition and the thickness of the absorption layer) into the current block layer.

According to the present invention, there is provided a light source device for a laser beam printer in which a semiconductor laser is driven with the pulse current having the minimum pulse width at the ON time on the order of milliseconds or less, the semiconductor laser comprising:

a double hetero junction structure in which an active layer is sandwiched with an n-type clad layer and a p-type clad layer; and a current block layer having a stripe groove provided in one of the n-type and p-type clad layers;

wherein a rate of change on the order of micro seconds at a rise portion of a light output of the semiconductor laser at the time of being driven by the pulse current is set in $\pm 8\%$ or less, by adjusting at least one of a width of the stripe groove, the number of quantum wells of the active layer, a composition of the clad layers, a distance between the current block layer and the active layer, a composition of the current block layer, a carrier concentration of the clad layers and the formation of a light absorption layer into the current block layer.

Here, the rate of change refers to the ratio of a peak output at the rise portion by the pulse drive and the leveled (stabilized) light output which is represented in %. The fact that the rate of change is negative means that the light output at the rise time is smaller than the leveled light output.

With such a structure of the light source device for the laser beam diode, the influence of the transient phenomenon does not appear even when the drive pulse width for the semiconductor laser becomes short, so that a beautiful printed image free from the irregularity in colors can be provided.

According to another aspect of the present invention, there is provided a light source device for a laser beam printer in which a semiconductor laser is driven with a pulse current having a minimum pulse width at the ON time on the order of milliseconds or less, said semiconductor laser comprising:
  a double hetero junction structure in which an active layer is sandwiched with an n-type clad layer and a p-type clad layer; and
  a current block layer having a stripe groove provided in one of the n-type and p-type clad layers;
  wherein the semiconductor laser is formed so that the semiconductor laser oscillates in a multiple mode in the vicinity of the threshold value of oscillation, and oscillates in a single mode at a current separated from the threshold value, by adjusting at least one of a width of the stripe groove, the number of quantum wells of the active layer, a composition of the clad layers, a distance between the current block layer and the active layer, a composition of the current block layer, a carrier concentration of the clad layers and the formation of a light absorption layer into the current block layer.

Here, the vicinity of the threshold value of oscillation refers to an operation current in the vicinity of the current value at which the laser begins to oscillate, and the current separated from the threshold value refers to an operation current larger than the threshold value, such as current of about 1.2 times of the threshold value current or more.

The active layer of the semiconductor laser is formed in the single or multiple quantum well (SQW or MQW) structure with the result that the rate of change can be reduced by the oscillation of the semiconductor laser in a multiple mode in the vicinity of the threshold value, during the single-mode oscillation at the current at the ordinal operations, with the adjustment of the degree of absorption.

Specifically, the semiconductor laser is formed so that the rate of change or the oscillation mode is obtained by setting the stripe width of the current block layer to a width of 4 to 6 $\mu$m; or by setting the composition of Al of the above clad layers made of $Al_xGa_{1-x}As$ ($0.4 \leq x \leq 0.7$) to not more than 0.65, current block layer being made of $Al_yGa_{1-y}As$ ($0.5 \leq y \leq 0.8$), as well as setting the number of the well layers in the active layer to 5 or more layers; or more preferably forming the clad layer between the block layer and the active layer to a thickness of 0.03 to 0.1 $\mu$m and forming the current block layer to a thickness of 0.2 to 0.5 $\mu$m; or by inserting an absorption layer into the current block layer made of $A_yGa_{1-y}As$ ($0.5 \leq y \leq 0.8$), the absorption layer being made of $Al_zGa_{1-z}As$ ($0.08 \leq z \leq 0.15$) within the scope of the thickness t of $200\ \text{Å} \leq t \leq 500\ \text{Å}$ in a distance h within the scope of $500\ \text{Å} \leq h \leq 1000\ \text{Å}$ from the bottom of the current block layer, the clad layer being made of $Al_xGa_{1-x}As$ ($0.4 \leq x \leq 0.7$); or by setting the composition of Al of the current block layer made of $Al_yGa_{1-y}As$ ($0.5 < y < 0.8$) into 0.65 or less, and forming the clad layer made of $Al_xGa_{1-x}As$ ($0.4 \leq x \leq 0.7$) between the current block layer and the active layer to a thickness of 0.15 to 0.25 $\mu$m; or by forming the clad layer between the current block layer and the active layer to a thickness of 0.25 to 0.5 $\mu$m, the clad layer being made of $Al_xGa_{1-x}As$ ($0.4 \leq x \leq 0.7$), and the current block layer being made of GaAs.

DETAILED DESCRIPTION OF THE INVENTION

Figure 1:
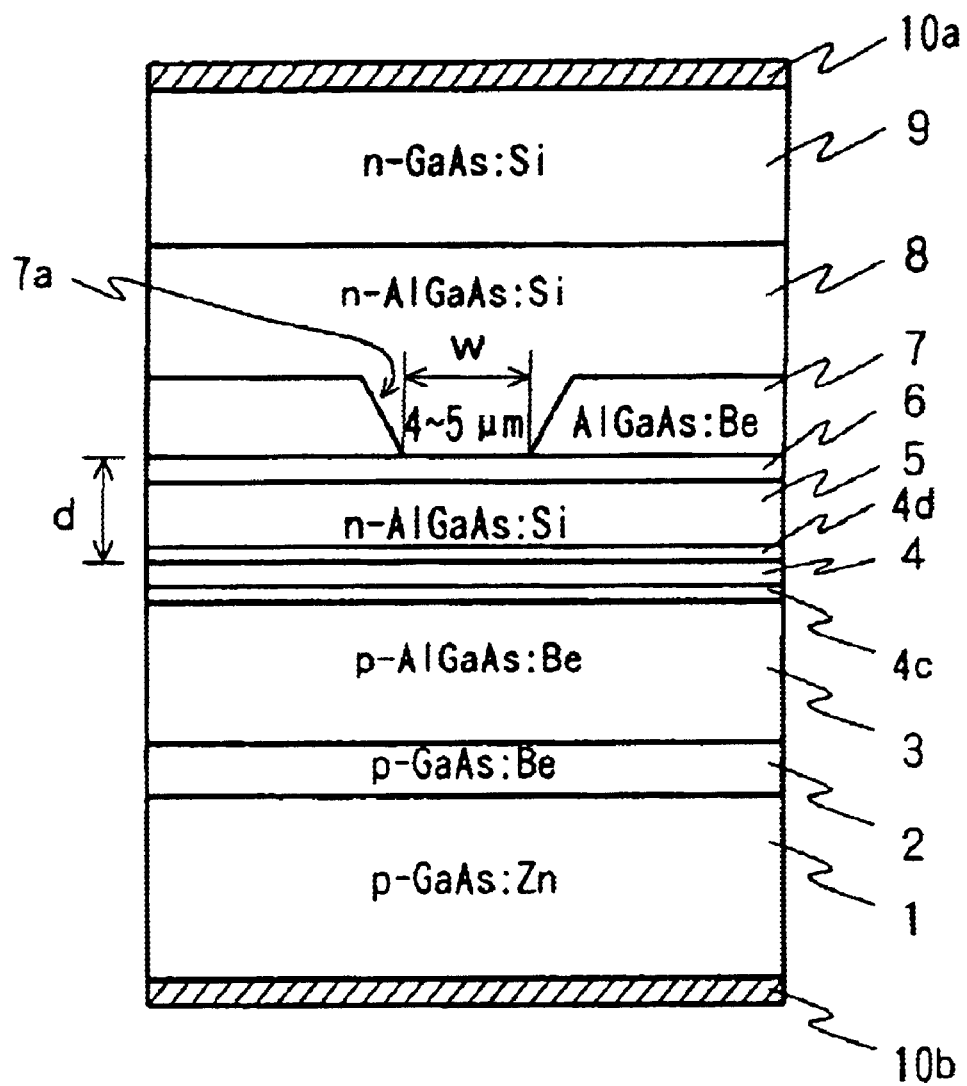
FIGS. 1(a) to 1(b) are views for explaining a section structure of an LD chip used in the light source device for a laser beam printer according to the present invention.
Figure 1:
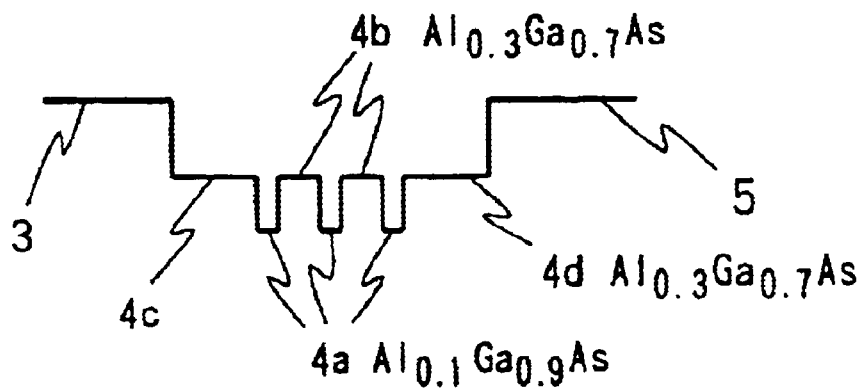

A light source device for a laser beam printer according to the present invention is a light source device for driving a semiconductor laser with a pulse current having a minimum pulse width at the ON time on the order of milliseconds or less, the semiconductor laser having a double hetero junction structure in which the active layer 4 is sandwiched with an n-type and a p-type clad layers 5 and 3, and a structure in which a current block layer 7 having a stripe groove 7a formed thereon is embedded in one of the clad layers (for example, n-type clad layers 5 and 8) as shown in explanatory sectional view of LD chip in FIG. 1, characterized in that the rate of change becomes ±8% or less at the rise portion of the pulse current, or the semiconductor laser oscillates in a multiple mode in the vicinity of the threshold value of oscillation and in a single mode at a current separated from the threshold value, by adjusting of at least one of the width w of the stripe groove 7a of the current block layer, the number of quantum wells in the active layer 4, the composition of the clad layer 5, a distance d between the current block layer 7 and the active layer 4, the composition of the current block layer 7 and the formation of the light absorption layer into the current block layer 7.

Figure 2:
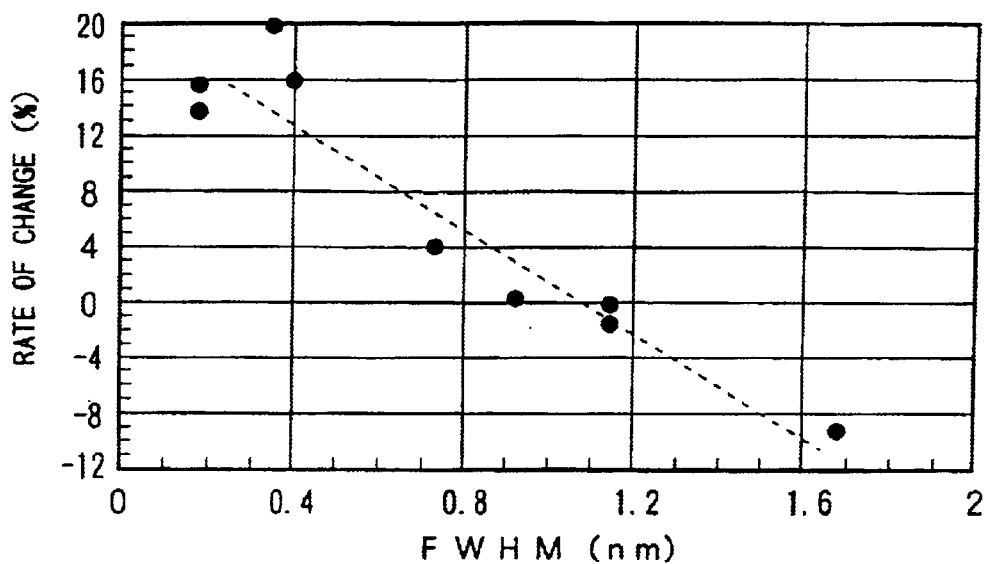
FIG. 2 is a view showing a relation between a half-value width FWHM of an oscillation spectrum of the semiconductor laser and a rate of change.

As has been described above, the inventors of the present invention have manufactured various semiconductor lasers in order to remove a transient phenomenon (a transient response) at a rise portion of a pulse in a light source device for a laser beam printer that is driven in a short pulse and examined various characteristics, and found that the rate of change changes with the half value width FWHM of the oscillation spectrum of the laser in the vicinity of oscillation and that a close relation exists between the FWHM and the rate of change of the transient phenomenon as shown in FIG. 2. The inventors have found that since the FWHM reflects in the mode number of the light spectrum, the rate of change can be set to a level of ±8% or less by allowing the FWHM to be set to a definite scope with the result that the influence of the irregularity in colors caused by the transient phenomenon can be eliminated.

In other words, in FIG. 2, the lateral axis shows various FWHM's (nm) when the operation current is of the level of 1.1 times ($I_{op}/I_{th}$ is approximately 1.1 times) of the operation threshold value whereas the longitudinal axis shows the rate of change (%) in the output of the semiconductor laser having that value of FWHM. In FIG. 2, the semiconductor laser having a measurement point at which the FWHM is 0.4 or less has a small half value width and is excited (oscillates) in a complete single mode. The semiconductor laser has a large rate of change of 14% or more. Furthermore, the semiconductor laser having a large FWHM on the order of 1.7 is excited in a multiple mode as can be seen in a semiconductor laser for use in the light source device for CD and DVD players. Thus, in such a case, the transient phenomenon becomes about −10% because the output (the head end output) at the rise of the pulse is too small. The inventors of the present invention have found that the light source device of laser beams which does not generate the irregularity in colors in the printed images can be obtained by providing a semiconductor laser which has a small rate of change of ±8% or less, preferably ±4% or less, or more preferably ±2% or less by the intermediate oscillation of the semiconductor laser.

Furthermore, after a diligent investigation, the inventors of the present invention have found that the oscillation spectrum or the FWHM thereof can be adjusted to a predetermined value by adjusting the absorption quantity of light oscillated. That adjustment is performed by, for example, the stripe width, the number of quantum wells in the active layer, the composition of the current block layer, a distance between the current block layer and the active layer, the material and the insertion place of the absorption layer which is inserted into the current block layer, and by the change of the carrier concentration in the clad layer. The inventors of the present invention have also found that there is provided an advantage that the adjustment of the FWHM to a predetermined value enlarges the absorption quantity of light which is excited with the increase in the width of the stripe width in the LD chip which is formed to be excited in a single mode, permits the increase in the value of FWHM (decreases the rate of change by the oscillation of the LD chip in the multiple mode) in the vicinity of the oscillation, and provides a widened FWHM by increasing the refraction index of the clad layer 5 (decreasing the mixed crystal ratio of Al in the AlGaAs type), and by decreasing the difference of refraction index between the active layer and the clad layer to weaken the confinement of light, and by increasing the number of the wells in the active layer to increase the absorption quantity of light. Furthermore, the inventors have found that there is provided an advantage that the FWHM can be widened with an increase in the loss of carriers by increasing the distance between the current block layer and the active layer, and the FWHM is widened in a similar manner by using a material with an absorption characteristic as the material for the current block layer, or providing a light absorption layer inside of the current block layer.

In this manner, the semiconductor laser is not excited in a complete single mode, or in a multiple mode. The semiconductor laser is basically excited in the single mode, and the oscillation mode thereof is transformed into the multiple mode at an operation current in the vicinity of the oscillation threshold value current, namely, in the vicinity of the rise in the pulse for the pulse drive, so that a transient phenomenon at the rise portion can be reduced. Incidentally, the above adjustment can be made with respect to only one item but the adjustment can be made with the combination of two items or more. With the adjustment of only one item, an appropriate design value can be obtained while investigating the relation between the half value of the above rate of change, or the oscillation spectrum (waveform), or the half value with respect to a definite operation current.

Next, a specific structure example of the invention will be explained in detail. The LD chip used in the light source device according to the present invention has a basic structure as shown in an example in FIG. 1. In FIG. 1, the temperature of the substrate 1 made of the p-type GaAs doped with, for example, Zn is set to about 500 to 750° C., on the substrate 1 a buffer layer 2 made of p-type GaAs doped with Be is laminated to a thickness of 0.1 to 2 μm, a p-type clad layer 3 made of p-type $Al_xGa_{1-x}As$ ($0.4 \leq x \leq 0.7$, for example, x=0.6) doped with Be is laminated to a thickness of about 1 to 2 μm, a p-type light guide layer 4c made of $Al_{0.3}Ga_{0.7}As$ doped with Be is laminated to a thickness of 0.01 to 0.05 μm, a non-doped $Al_{0.1}Ga_{0.9}As$ well layer 4a, a thickness of 3 to 6 nm, and a $Al_{0.3}Ga_{0.7}As$ barrier layer 4b, a thickness of 6 to 8 nm, are laminated one on the other, as shown in FIG. 1(b), an active layer 4 having a MQW structure with a lamination of three well layers 4a, an n-type guide layer 4d made of $Al_{0.3}Ga_{0.7}As$ doped with Si with a thickness of about 0.01 to 0.05 μm, an n-type first clad layer 5 comprising $Al_xGa_{1-x}As$ ($0.4 \leq x \leq 0.7$, for example x=0.6) with a thickness of about 0.03 to 0.1 μm, an n-type etching stop layer 6 comprising InGaAlP doped with Si with a thickness of 0.01 to 0.05 μm, and a p-type current block layer 7 comprising $Al_yGa_{1-y}As$ ($0.5 \leq x \leq 0.8$, for example y=0.7) doped with Be with a thickness of 0.2 to 0.5 μm, respectively.

After that, a wafer is temporarily taken out from the MOCVD apparatus and a stripe groove 7a is formed by means of a photolithography process and etching with a mixed solution of tartaric acid and a hydrogen peroxide solution. Conventionally, the width w of this stripe groove 7a was about 2 to 3 μm, but the stripe width is formed in about 4 to 6 μm. After that, the wafer is placed in the MOCVD apparatus again, so that the n-type second clad layer 8 made of an n-type $Al_xGa_{1-x}As$ ($0.4 \leq x \leq 0.7$, for example x=0.6) doped with Si is grown to a thickness of 0.5 to 2 μm, and an n-type contact layer 9 made of GaAs doped with Si is grown to a thickness of 0.5 to 2 μm respectively. Then, the back surface of the GaAs substrate 1 is ground and polished, and Au—Ge/Ni film is formed on the surface side of the laminated semiconductor surface by means of vacuum vapor deposition. After the sintering of the semiconductor surface at 300 to 400° C., a Ti/Au laminated layer is provided and an n-side electrode 10a is formed. Further a Ti/Au laminated layer is provided on the back surface of the GaAs substrate, and a p-side electrode 10b is formed on the back surface of the GaAs substrate 1. By means of chipping with dicing and cleavage, an LD chip having a structure shown in FIG. 1(a) is obtained.

Figure 3:
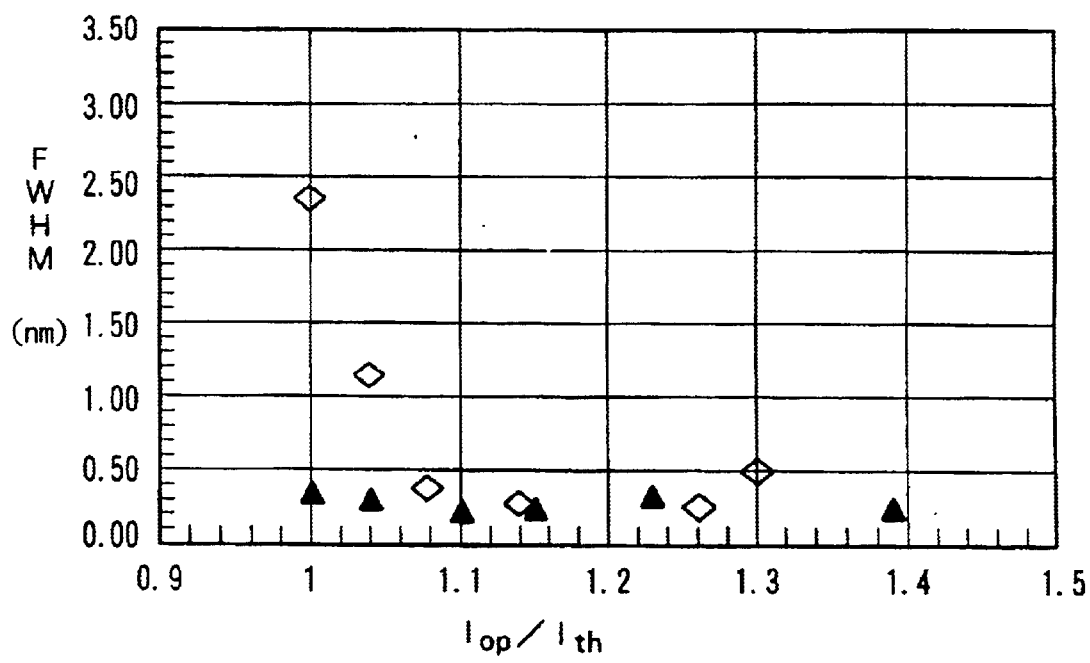
FIG. 3 is a view showing a comparison between the relation of the FWHM with respect to the operation current of one example of the LD in which the rate of change is changed according to the present invention.

The result of the investigation regarding ratio ($I_{op}/I_{th}$) of operation current ($I_{op}$) to the threshold value ($I_{th}$) of oscillation made between the conventional case of the stripe groove having a width of 2 to 3 μm and the case of the present invention having the width of 4 to 6 μm is shown in FIG. 3. In FIG. 3, the black triangle shows the conventional case of 2 to 3 μm whereas the white diamond shape shows the case of 4 to 6 μm according to the present invention. As apparent from FIG. 3, the FWHM is small over the whole scope of the operation current in the conventional structure. And from the beginning, the semiconductor laser is excited in a single mode. According to the present invention, the FWHM is large in the vicinity of the threshold value, and the semiconductor laser is excited in a multiple mode. According to the present invention, it can be seen that the FWHM is large and the semiconductor laser is excited in a multiple mode, and when the operation current becomes 1.1 times as large as the threshold value, the FWHM becomes small and the semiconductor is excited almost in a single mode. In other words, the rate of change can be reduced very much with this averaging procedure. Furthermore, it has been confirmed that the light output waveform at this time does not generate a transient phenomenon in almost all cases at the rise portion of the pulse. Incidentally, in this example, the substrate 1 is formed in the p-type structure, but the substrate 1 may be formed in n-type structure. Even when the above conductivity is all placed on the opposite conductivity and the upper layer is formed in p-type, the same result is obtained.

Figure 4:
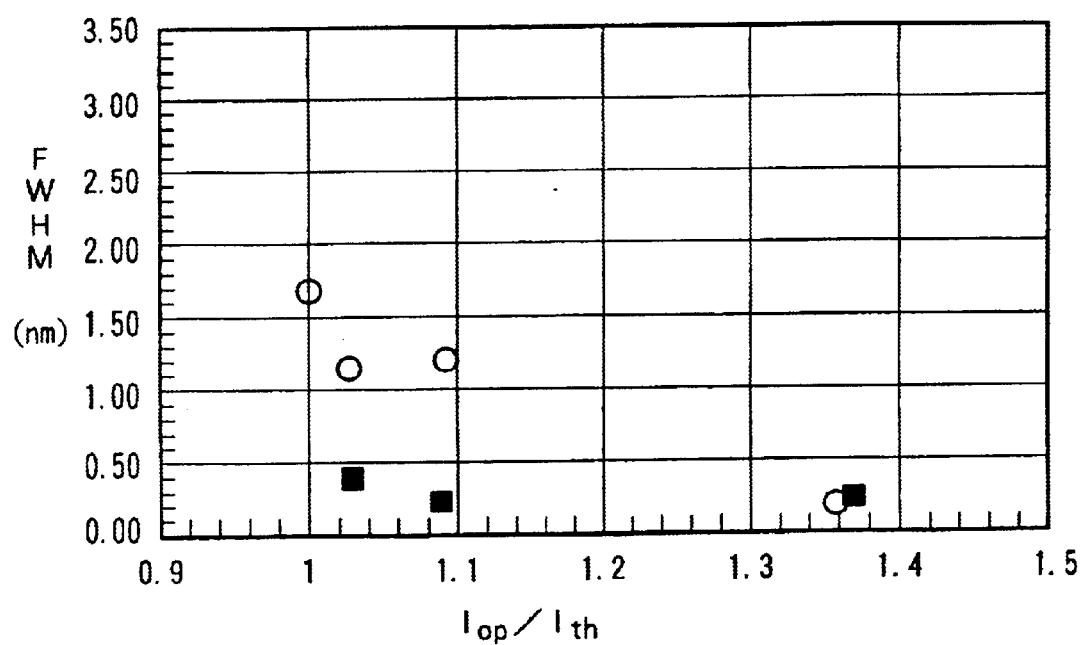
FIG. 4 is a view showing a comparison of a conventional structure with the FWHM with respect to one example of LD in which the rate of change is adjusted with the present invention.

Furthermore, in the same structure as described above, the stripe width is set to a conventional level of 3 to 4 μm, and the composition of Al in both clad layers 3, 5 and 8 is changed from 0.6 to 0.5. At the same time, the active layer of MQW is manufactured with an increased well layer from 3 to 5 layer. The characteristic of this example such as FIG. 3 is shown compared with the conventional one in FIG. 4. In FIG. 4, the black square shows a conventional structure. The white round shows an example of a change in the above composition and an increased number of the well layers. In this case, according to the present invention in the same manner as the above example, the operation current comes close to the threshold value current ($I_{op}/I_{th}$ is close to 1), the FWHM is large and the semiconductor laser is excited in the multiple mode. But, it can be seen that when the operation current is larger than the threshold value current, FWHM becomes small, and the semiconductor laser is operated in a single mode. Incidentally, in this example, both the number of the well layers and the composition of the clad layers are changed at the same time, but either of the number or the composition can be adjusted.

Figure 5:
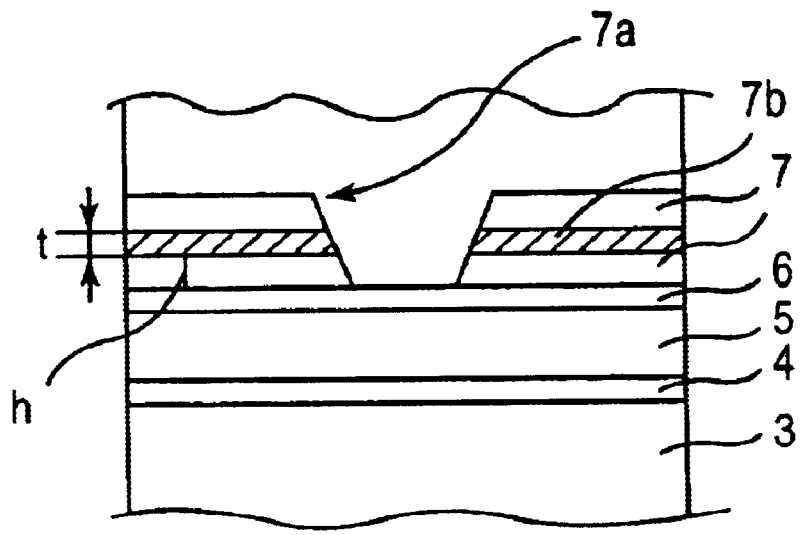
FIG. 5 is a view for explaining a part of another example of the LD chip in which the rate of change is adjusted with the present invention.

FIG. 5 is an explanatory view showing another example of an adjustment method. In this example, in the LD chip having the above structure, an absorption layer 7b is inserted inside of the current block layer made of $Al_{0.7}Ga_{0.3}As$, the absorption layer 7b is made of $Al_zGa_{1-z}As$ ($0.08 \leq z \leq 0.15$) to a thickness t of 200 Å $\leq t \leq$ 500 Å and in a distance h from the bottom of the current block layer 7 of 500 Å $\leq h \geq$ 1000 Å. And the same result was obtained. This is the reason that the current block layer 7 does not absorb light, but a part of light which is emitted in the active layer is absorbed by of the absorption layer 7b, so that the semiconductor laser is excited in a multiple mode in the vicinity of the oscillation threshold value $I_{th}$ as described above.

Instead of the insertion of the above light absorption layer 7b into the current block layer 7, the composition of the current block layer 7 may be changed, for example, the mixed crystal ratio of Al was decreased, for example, from 0.7 to 0.63, and the thickness of the clad layer 5 was enlarged to a level of 1500 to 2500 Å, and then the widening of the carrier distribution was increased and the same result was obtained.

Figure 6:
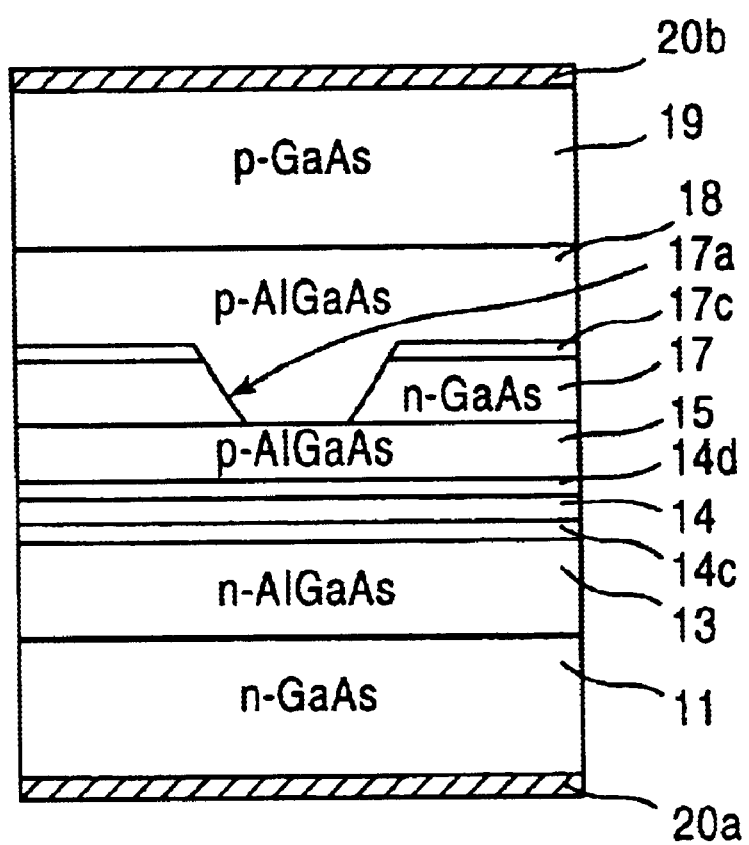
FIG. 6 is a view for explaining an example of a structure of the LD chip used in the light source device of the present invention.

FIG. 6 shows another example of a structure of the LD chip used in the light source device according to the present invention. This example is such that the substrate temperature is set to about 500 to 700° C. followed by alternately laminating on the n-type GaAs substrate 11 by means of the MBE (Molecular Beam Epitaxy) process an n-type clad layer 13 made of $Al_xGa_{1-x}As$ ($0.4 \leq x \leq 0.7$) doped with Si to a thickness of about 2 μm, an n-type light guide layer 14c made of $Al_{0.3}Ga_{0.7}As$ doped with Si to a thickness of 0.02 to 0.05 μm, an non-doped active layer 14 having an MQW layer comprising well layer made of $Al_{0.1}Ga_{0.9}As$ to a thickness of 3 to 6 nm and a barrier layer made of $Al_{0.3}Ga_{0.7}As$ to a thickness of 6 to 8 nm, in which well layers are laminated in three layers, a p-type light guide layer 14d made of $Al_{0.3}Ga_{0.7}As$ doped with Be to a thickness of about 0.02 to 0.05 μm, a p-type first clad layer 15 made of p-type $Al_xGa_{1-x}As$ doped with Be ($0.4 \leq x \leq 0.7$) to a thickness of about 0.25 to 0.5 μm, a current block layer 17 made of GaAs doped with Si to a thickness of about 0.2 to 0.5 μm, and a non-doped evaporation prevention layer 17c comprising $Al_sGa_{1-s}As$ ($0.05 \leq s \leq 0.15$) to a thickness of about 0.02 to 0.05 μm. After that, the wafer is temporarily taken out from a growing apparatus and a recessed portion constituting a stripe groove 17a is formed so that the wafer remains to a thickness of about 0.05 to 0.2 μm on the bottom of the GaAs current block layer 17 by the photolithography process and wet etching with a mixed solution of sulfuric acid and hydrogen peroxide.

After that, the wafer is placed again in the growing apparatus and the substrate temperature is set to about 600 to 800° C. while irradiating the wafer with As. Then the GaAs layer which remains on the bottom of the current block layer 17 is evaporated and a thermal etching is performed. Then a stripe groove 17a having a width of 3 to 5 μm is formed. After that, a p-type second clad layer 18 made of $Al_xGa_{1-x}As$ ($0.4 \leq x \leq 0.7$) doped with Be is grown to a thickness of about 0.5 to 2 μm, a contact layer 19 made of GaAs doped with Be is grown to a thickness of about 0.5 to 2 μm, respectively, and then the epitaxial growth is terminated. Then the back surface of the wafer is ground and polished and the wafer is thinned down, Au-Ge/Ni is deposited on the back surface thereof by means of the vapor deposition and sintered at 300 to 400° C. The laminated layer of Ti/Au layer is provided by means of vapor deposition, so that an n-side electrode 20a is provided and a p-side electrode 20b made of Ti/Au is provided on the surface of laminated semiconductor layers in a same manner. Then, both electrodes are formed into chips by means of dicing and cleavage.

In this structure, a material that absorbs light of GaAs is used in the current block layer. An appropriate quantity can be provided by adjusting the distance between the current block layer and the active layer. The semiconductor laser is operated in a multiple mode. At an operation current separated from the threshold value, the semiconductor laser which is operated in a single mode, namely, the semiconductor laser having the above rate of change or FWHM are obtained.

Figure 7A:
FIGS. 7(a) to 7(b) are views showing a waveform of a light output by the pulse driving of the LD according to the present invention.
Figure 7B:
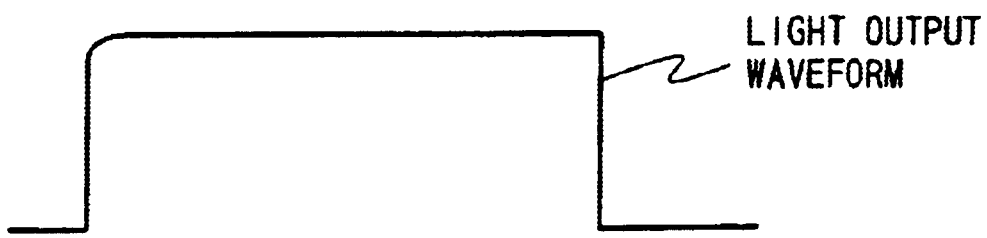
Figure 8:
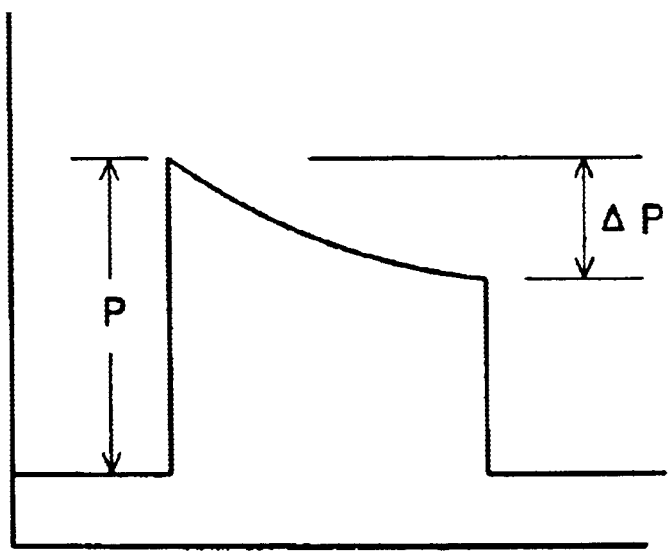
FIG. 8 is a waveform of a light output by the pulse drive in the case where the droop of the light source device for a general laser beam printer is present.
Figure 9A:
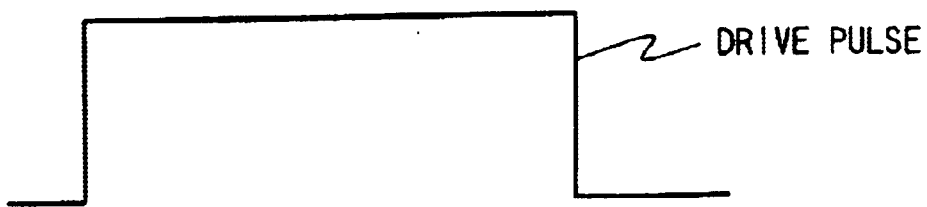
FIGS. 9(a) to 9(c) are views showing a light output waveform of the drive pulse and the LD in a single mode oscillation and in a multiple mode.
Figure 9B:
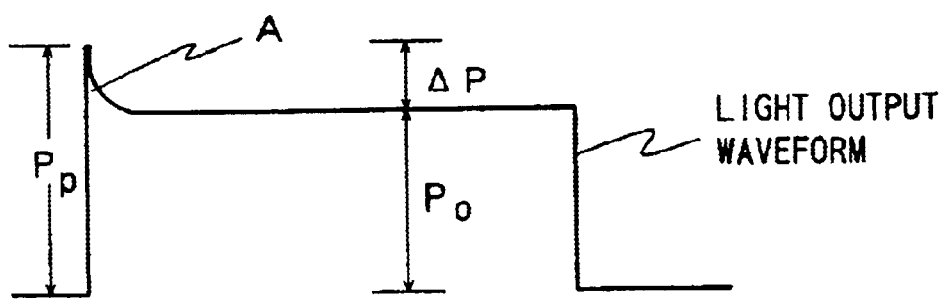
Figure 9C:
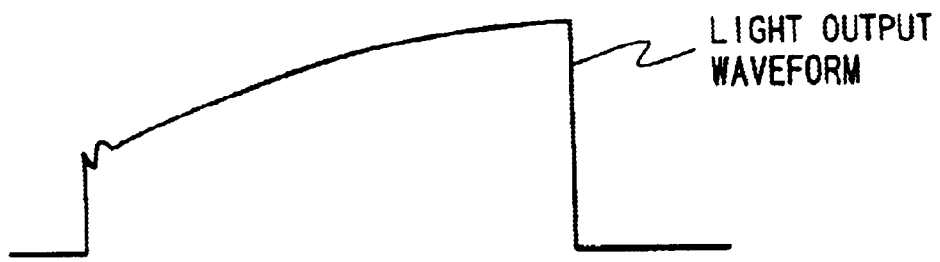

According to light source device for the laser beam printer according to the present invention; the semiconductor laser is excited in a multiple mode in the vicinity of the threshold value, and the semiconductor laser is excited in a single mode at an operation current separated from the threshold value current. Since the input electric power has to be distributed to a plurality of modes because of the multiple mode oscillation in the vicinity of the threshold value, the rise of the semiconductor laser is delayed as compared with the single mode operation in the vicinity of the threshold value. When the operation current becomes larger than the threshold value, the semiconductor laser is excited in a single mode with the result that a regular light output can be obtained immediately. As a consequence, as shown in FIG. 7, the transient phenomenon becomes very small at the rise portion of the pulse drive. Thus, since the printing speed of the printer is raised, the pulse width at the ON time of the drive pulse becomes very narrow to a level of milliseconds, and further to micro seconds, the irregularity in colors in printed characters with the result that clear printing images can be provided.

According to the present invention, the rate of change becomes so small at the rise portion of the pulse in the semiconductor laser which emits light by the pulse drive of the laser beam printer that the influence of the transient phenomenon ceases to exit even when the pulse width becomes short to a level of several hundred micro seconds, and further to micro seconds. Thus, a light source device can be provided in which a stable light output can be obtained and a stable printing images free from the irregularity in colors can be obtained. As a consequence, this will contribute toward the short pulse drive for raising the printing speed with which more and more severe demand will be made from now on.

Although preferred example have been described in some detail it is to be understood that certain changes can be made by those skilled in the art without departing from the spirit and scope of the invention as defined by the appended claims.

What is claimed is:

1. A light source device for a laser beam printer including a semiconductor laser, said semiconductor laser comprising:
   a double hetero junction structure in which an active layer formed in a quantum well structure is sandwiched with an n-type clad layer and a p-type clad layer; and
   a current block layer having a stripe groove provided in one of said n-type and p-type clad layers;
   said semiconductor laser is driven with a pulse current having a minimum pulse width ON time of milliseconds or less so as to have a rate of output power change of +8% to −8% at micro seconds of the rise portion, when said semiconductor laser is driven by the pulse current.

2. The light source device of claim 1, wherein said semiconductor laser is formed so that said rate of change is obtained by widening the width of said stripe groove between 4 $\mu$m and 6 $\mu$m.

3. The light source device of claim 1, wherein said clad layers are made of $Al_xGa_{1-x}As$ ($0.4 \leq x \leq 0.7$) and said current block layer is made of $Al_yGa_{1-y}As$ ($0.5 \leq y \leq 0.8$), and wherein said rate of change is obtained by setting the composition of Al of said current block layer to 0.65 or less, and setting the number of quantum wells of said active layer to five or more.

4. The light source device of claim 3, wherein a clad layer between said current block layer and said active layer is formed to a thickness between 0.03 $\mu$m and 0.1 $\mu$m, and said current block layer is formed to a thickness between 0.2 $\mu$m and 0.5 $\mu$m.

5. The light source device of claim 1, wherein said clad layers are made of $Al_xGa_{1-x}As$ ($0.4 \leq x \leq 0.7$) and said current block layer is made of $Al_yGa_{1-y}As$ ($0.5 \leq y \leq 0.8$), and wherein said rate of change is obtained by inserting a light absorption layer made of $Al_zGa_{1-z}As$ ($0.08 \leq z \leq 0.15$) into said current block layer, said light absorption layer having a thickness t between 200 Å and 500 Å in a distance h between 500 Å and 1000 Å from the bottom of said current block layer.

6. The light source device of claim 1, wherein said clad layers are made of $Al_xGa_{1-x}As$ ($0.4 \leq x \leq 0.7$) and said current block layer is made of $Al_yGa_{1-y}As$ ($0.5 \leq y \leq 0.8$), and wherein said rate of change is obtained by setting the composition of Al of said current block layer to 0.65 or less, and forming said current block layer so that a clad layer between said current block layer and said active layer has a thickness between 0.15 $\mu$m and 0.25 $\mu$m.

7. The light source device of claim 1, wherein said clad layers are made of $Al_xGa_{1-x}As$ ($0.4 \leq x \leq 0.7$), and said current block layer is made of GaAs, and wherein said rate of change is obtained by forming said current block layer so that a clad layer between said current block layer and said active layer has a thickness between 0.25 $\mu$m and 0.5 $\mu$m.

8. A light source device for a laser beam printer including a semiconductor laser, said semiconductor laser comprising:
   a double hetero junction structure in which an active layer formed in a quantum well structure is sandwiched with an n-type clad layer and a p-type clad layer; and
   a current block layer having a stripe groove provided in one of said n-type and p-type clad layers;
   wherein said semiconductor laser is driven with a pulse current having a pulse width ON time of milliseconds or less so as to oscillate in a multiple mode in the vicinity of the threshold value of oscillation, and oscillate in a single mode at a current of substantially 1.2 times or more of said threshold value.

9. The light source device of claim 8, wherein said semiconductor laser is formed so that said oscillation mode is obtained by widening the width of said stripe groove between 4 $\mu$m and 6 $\mu$m.

10. The light source device of claim 8, wherein said clad layers are made of $Al_xGa_{1-x}As$ ($0.4 \leq x \leq 0.7$) and said current block layer is made of $Al_yGa_{1-y}As$ ($0.5 \leq y \leq 0.8$), and wherein said oscillation mode is obtained by setting the composition of Al of said current block layer to 0.65 or less, and setting the number of quantum wells of said active layer to five or more.

11. The light source device of claim 10, wherein a clad layer between said current block layer and said active layer is formed to a thickness between 0.03 $\mu$m and 0.1 $\mu$m and said current block layer is formed to a thickness between 0.2 $\mu$m and 0.5 $\mu$m.

12. The light source device of claim 8, wherein said clad layers are made of $Al_xGa_{1-x}As$ ($0.4 \leq x \leq 0.7$) and said current block layer is made of $Al_yGa_{1-y}As$ ($0.5 \leq y \leq 0.8$) wherein said oscillation mode is obtained by inserting a light absorption layer made of $Al_zGa_{1-z}As$ $0.08 z \leq z \leq 0.15$) into said current block layer, said light absorption layer having a thickness t between 200 Å and 500 Å and being a distance h between 500 Å and 1000 Å from the bottom of said current block layer.

13. The light source device of claim 8, wherein said clad layers are made of $Al_xGa_{1-x}As$ ($0.4 \leq x \leq 0.7$) and said current block layer is made of $Al_yGa_{1-y}As$ (0.5#y#0.8), and wherein said oscillation mode is obtained by setting the composition of Al of said current block layer to 0.65 or less, and forming said current block layer so that a clad layer between said current block layer and said active layer has a thickness between 0.15 $\mu$m and 0.25 $\mu$m.

14. The light source device of claim 8, wherein said clad layers are made of $Al_xGa_{1-x}As$ ($0.4 \leq x \leq 0.7$), and said current block layer is made of GaAs, and wherein said oscillation mode is obtained by forming said current block layer so that a clad layer between said current block layer and said active layer has a thickness between 0.25 $\mu$m and 0.5 $\mu$m.

* * * * *